(12) United States Patent
Chatterjee

(10) Patent No.: US 7,579,258 B2
(45) Date of Patent: Aug. 25, 2009

(54) SEMICONDUCTOR INTERCONNECT HAVING ADJACENT RESERVOIR FOR BONDING AND METHOD FOR FORMATION

(75) Inventor: Ritwik Chatterjee, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 281 days.

(21) Appl. No.: 11/339,132

(22) Filed: Jan. 25, 2006

(65) Prior Publication Data

US 2007/0170584 A1  Jul. 26, 2007

(51) Int. Cl.
H01L 21/30 (2006.01)
H01L 21/46 (2006.01)
H01L 21/4763 (2006.01)

(52) U.S. Cl. .............................. 438/455; 257/E21.503; 257/E21.576; 438/624

(58) Field of Classification Search ................. 438/455, 438/624, 637; 257/E21.503, E21.705, E21.576, 257/E21.577
See application file for complete search history.

(56) References Cited

U.S. PATENT DOCUMENTS

| 4,818,728 | A | 4/1989 | Rai et al. |
| 5,817,572 | A | 10/1998 | Chiang et al. |
| 6,080,640 | A | 6/2000 | Gardner et al. |
| 6,232,219 | B1 | 5/2001 | Blalock et al. |
| 6,887,769 | B2 | 5/2005 | Kellar et al. |
| 6,962,835 | B2 | 11/2005 | Tong et al. |
| 2002/0160596 | A1 | 10/2002 | Weinrich et al. |
| 2005/0161795 | A1 | 7/2005 | Tong et al. |
| 2006/0003547 | A1 | 1/2006 | Kobrinsky et al. |
| 2006/0292824 | A1 | 12/2006 | Beyne et al. |

OTHER PUBLICATIONS

PCT/US06/61737 International Search Report.

Primary Examiner—Walter L Lindsay, Jr.
(74) Attorney, Agent, or Firm—Joanna G. Chiu; Robert J. King

(57) ABSTRACT

A semiconductor device and method has interconnects with adjoining reservoir openings. A dielectric layer is formed as part of an uppermost of the one or more interconnect layers. Openings formed in the dielectric layer result in modified portions of the dielectric layer along portions of sidewalls of the openings. The openings are filled with a conductive material, such as metal. An exposed portion of the dielectric layer is removed to form protruding pads of the conductive material extending above the dielectric layer. Reservoir openings are formed adjacent the protruding pads by removing the modified portions of the dielectric layer. When the semiconductor device is bonded with another device, either a wafer or a die, laterally flowing metal collects in the reservoir openings and ensures that a reliable electrical connection is made between the semiconductor device and the other device.

10 Claims, 8 Drawing Sheets

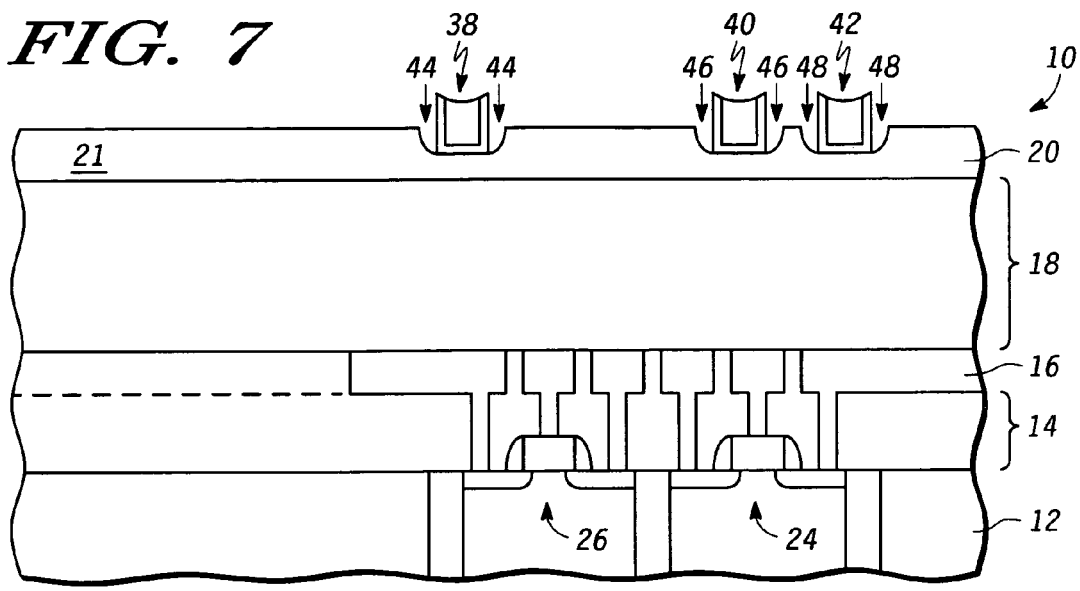
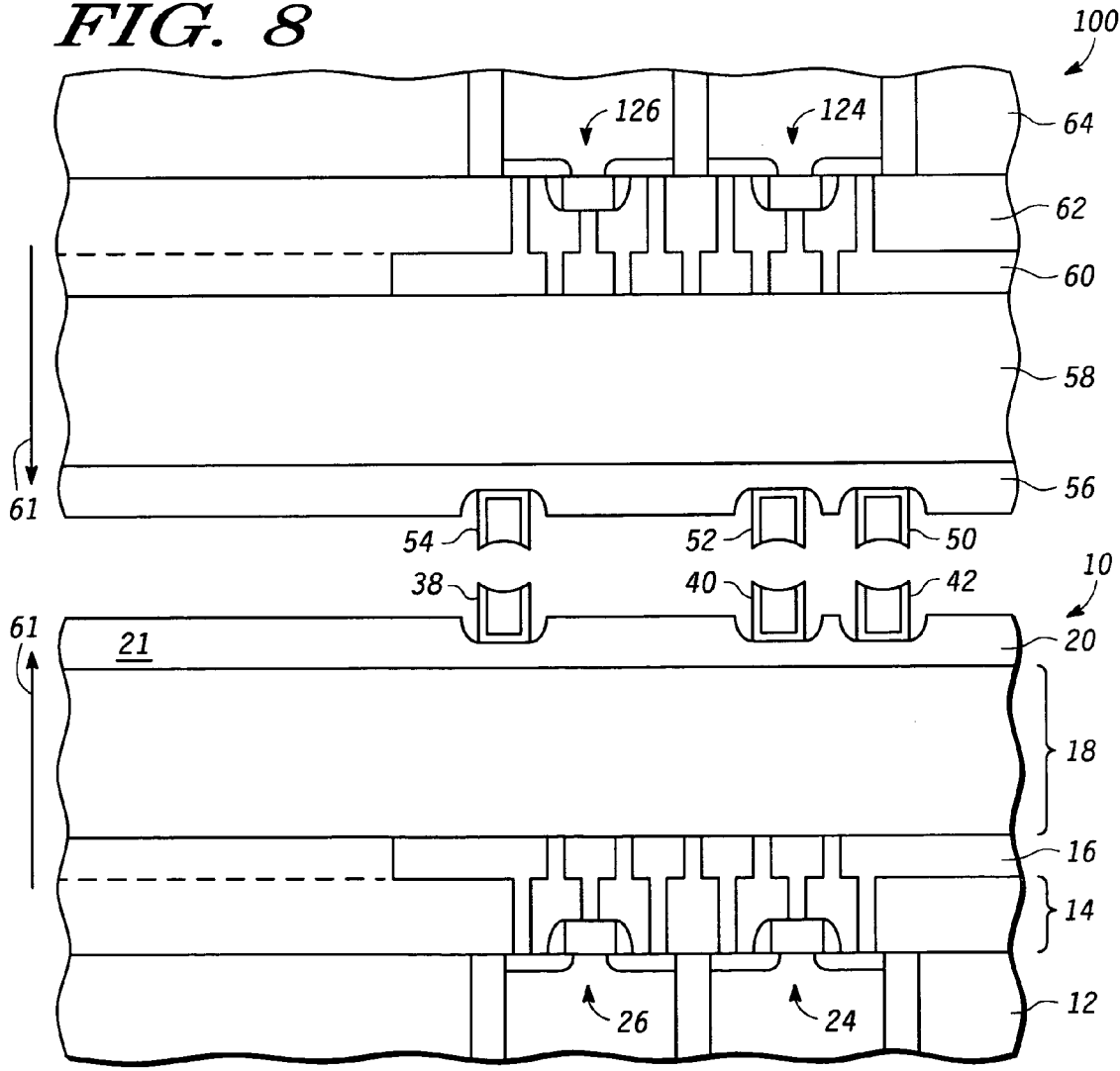

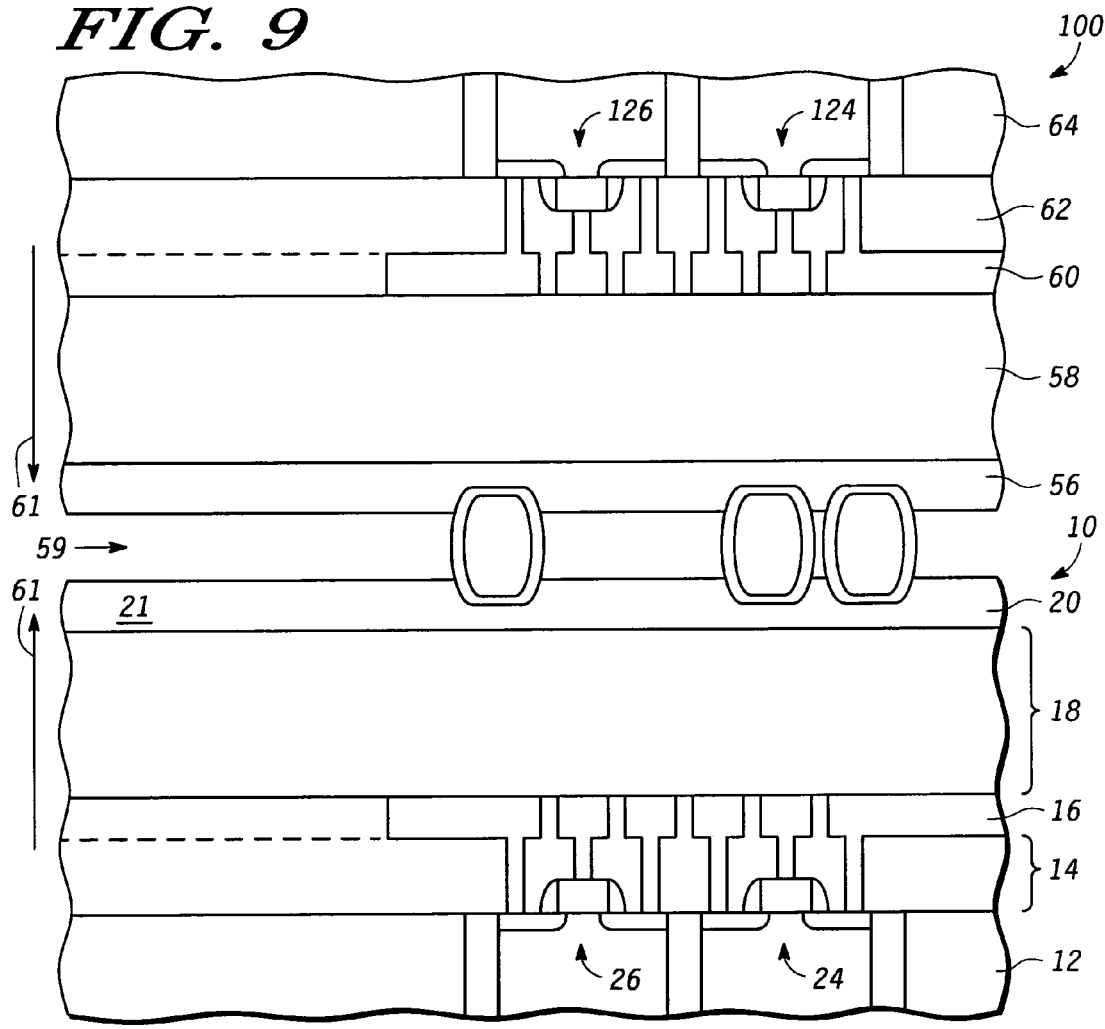
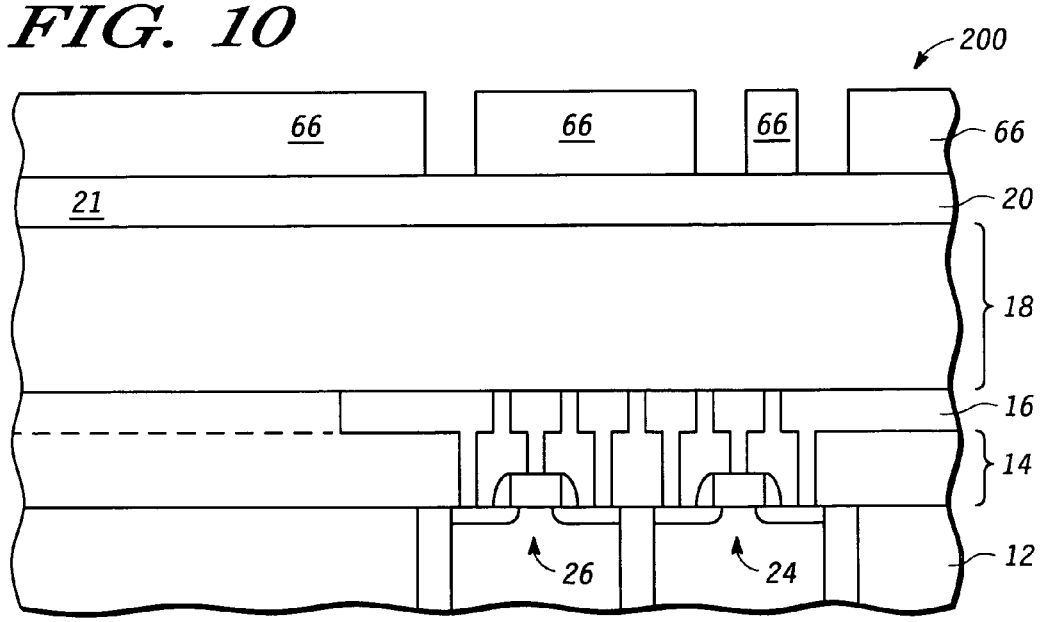

SEMICONDUCTOR INTERCONNECT HAVING ADJACENT RESERVOIR FOR BONDING AND METHOD FOR FORMATION

FIELD OF THE INVENTION

This invention relates generally to semiconductor processing, and more specifically, to semiconductor interconnects between bonded structures.

RELATED ART

As technology advances, the complexity of integrated circuits (ICs) has also increased, requiring increasing numbers of connected transistors and other circuit elements. Many electronic systems today use multiple integrated circuits to perform the desired functions. For example, one technology available today is three-dimensional (3-D) vertical stack technology in which multiple wafers or dies are vertically stacked on a common substrate in order to achieve multiple levels of active circuitry. For example, wafers or die can be stacked in a face to back orientation where the face of one wafer or die is attached to the back of another wafer or die. Alternatively, wafers or die can be stacked in a face to face orientation where the face of one wafer or die is attached to the face of another wafer or die. In order to make electrical connections between the stacked wafers or die, metal bond pads of each wafer or die in the stack are bonded to the metal bond pads of another wafer or die in the stack. However, due to surface variations across the wafers or die, the metal-to-metal bonding of the metal bond pads can be unreliable, resulting in unreliable interconnections.

BRIEF DESCRIPTION OF THE DRAWINGS

The present invention is illustrated by way of example and is not limited by the accompanying figures, in which like references indicate similar elements.

FIGS. 1-7 illustrate cross sectional views at various stages of forming a semiconductor structure in accordance with one embodiment of the present invention.

FIGS. 8 and 9 illustrate cross sectional view of attaching two semiconductor structures in accordance with one embodiment of the present invention.

FIGS. 10-15 illustrate cross sectional view at various stages of forming a semiconductor structure in accordance with an alternate embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

With 3-D vertical stack technology, stacks of wafer or die may be formed which result in multiple vertically stacked levels of active circuitry. In one embodiment, a die may be vertically stacked onto another die (die to die integration) or onto another wafer (die to wafer integration). In another embodiment, a wafer may be vertically stacked onto another wafer (wafer to wafer integration). As discussed above, electrical connections are made by bonding metal bond pads of one die or wafer to those of another die to wafer. However, surface variations may lead to unreliable interconnects. Therefore, in one embodiment of the present invention, protruding metal bond pads are made such that they extend above the final dielectric layer and reservoirs are formed adjacent the protruding metal bond pads in order to allow for improved semiconductor interconnects.

Figure 1:
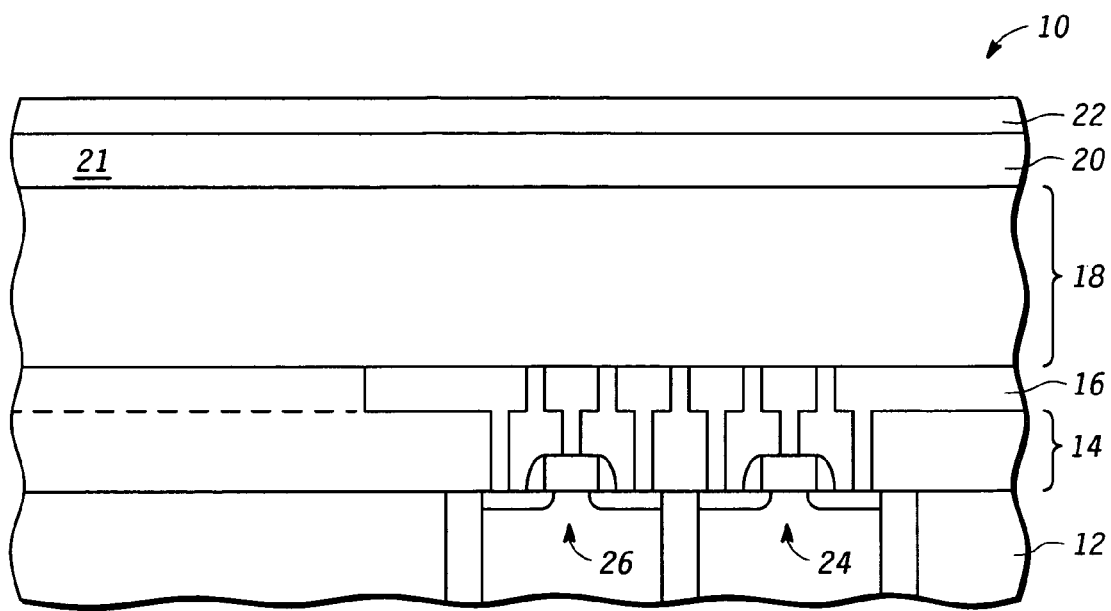

FIGS. 1-7 illustrate a method for forming a semiconductor structure 10 in accordance with one embodiment of the present invention. FIG. 1 illustrates semiconductor 10 having a substrate 12, a device and contact layer 14 overlying substrate 12, a first interconnect layer 16 overlying device and contact layer 14, one or more interconnect layer(s) 18 overlying first interconnect layer 16, a final interconnect layer 20 overlying one or more interconnect layer(s) 18, and a capping layer 22 overlying final interconnect layer 20. Substrate 12 can be any type of semiconductor substrate such as a bulk substrate or semiconductor-on-insulator substrate (SOI) and may include any type of semiconductor material or combinations of materials, such as gallium arsenide, silicon germanium, silicon, monocrystalline silicon, the like, and combinations of the above. Active circuitry is formed on and within substrate 12, where the active circuitry may perform any function or variety of functions. The active circuitry includes any number and type of transistors, such as transistors 26 and 24. Note that transistors 26 and 24 are formed in substrate 12 and device and contact layer 14, and may be any type of transistor having, for example, various different types of source and drain regions, gate dielectrics, gate stacks, spacers, etc., as known in the art. The transistors may be separated by isolation regions in substrate 12, as illustrated in FIG. 1. Although only two transistors are illustrated, semiconductor structure 10 may include any number of transistors to form any type of circuitry.

Device and contact layer 14 also includes contacts which make electrical contact to the transistors, such as transistors 26 and 24, and extend up to first interconnect layer 16. One or more interconnect layer(s) 18, overlying first interconnect layer 16, may include any number of via and trench layers, as needed, to route signals from first interconnect layer 16 to other devices on substrate 12 and to final interconnect layer 20. In one embodiment, each of one or more interconnect layer(s) 18 includes a dielectric material having a plurality of conductive portions (such as metal vias or metal trenches) to route signals, and can be formed using conventional processes. The conductive portions may include, for example, a metal, such as aluminum or copper. Final interconnect layer 20 includes a dielectric 21 in which metal vias and trenches will be formed to form metal bond pads. In one embodiment, dielectric 21 is a dielectric having a low dielectric constant (K) such as a K less than about 4.0. In one embodiment, dielectric 21 includes SiCOH or other carbon-containing dielectrics. Note that final interconnect layer 20 may include any number of dielectric layers.

In one embodiment, capping layer 22 is an insulating capping layer, such as, for example, a tetraorthosilicate (TEOS) deposited dielectric layer. Alternatively, deposition of capping layer 22 may be performed using silane, methyl silane, dimethyl silane, trimethyl silane, oxygen, or combinations thereof. In one embodiment, capping layer 22 protects underlying portions of dielectric 21. Also, in one embodiment, capping layer 22 is dissimilar in material from dielectric 21. For example, in one embodiment, dielectric 21 includes carbon while capping layer 22 does not.

Note that, in one embodiment, capping layer 22 may be referred to as part of final interconnect layer 20. Also, in one embodiment, final interconnect layer 20 may be referred to as an uppermost layer of one or more interconnect layer(s) 18.

Figure 2:
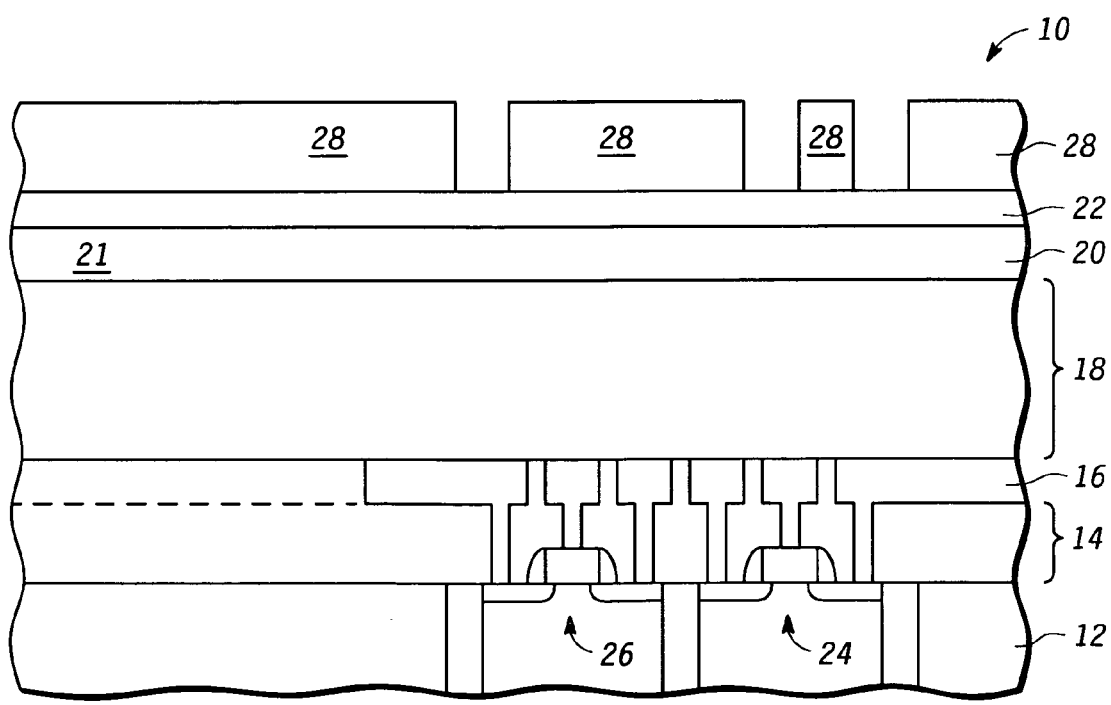

FIG. 2 illustrates semiconductor structure 10 after formation of a patterned masking layer 28 over capping layer 22, where patterned masking layer 28 defines a plurality of openings. In one embodiment, patterned masking layer 28 is a patterned photoresist layer that may be formed using conventional processing techniques.

Figure 3:
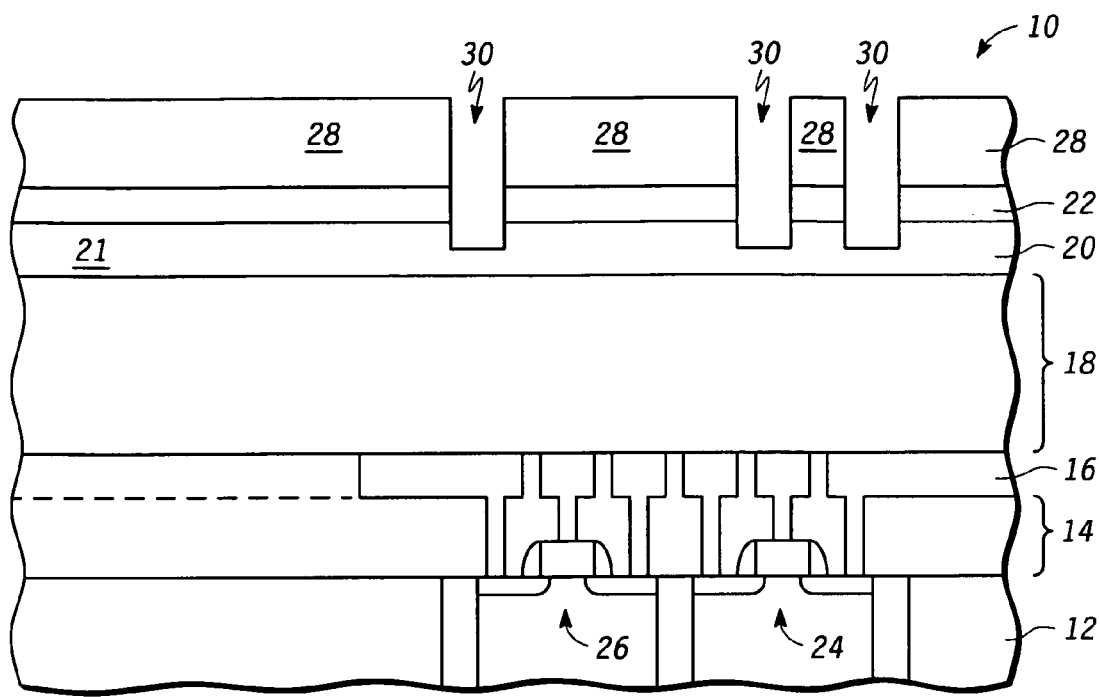

FIG. 3 illustrates semiconductor structure 10 after formation of openings 30 using patterned masking layer 28. In one embodiment, a dry reactive ion etch (RIE) using fluorocarbon chemistries, such as $CF_4$, $C_2F_6$, $C_3F_8$, etc., is used to form openings 30 which extend into dielectric 21 of final interconnect layer 20. In one embodiment, multiple etch steps may be used to form openings 30. For example, a first etch chemistry may be used to etch through capping layer 22, and a second etch chemistry may be used to etch into dielectric 21.

Figure 4:
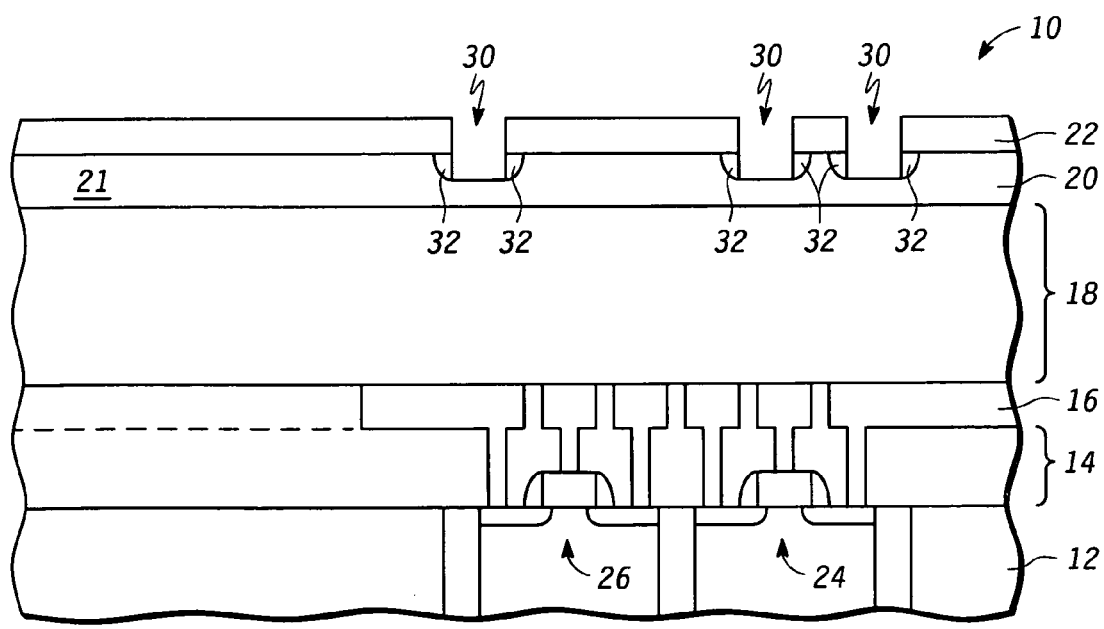

FIG. 4 illustrates semiconductor structure 10 after removal of patterned masking layer 28. In one embodiment, patterned masking layer 28 is removed in an oxidizing etch environment using, for example, an oxygen-containing chemistry or a carbon monoxide chemistry in a plasma environment. The use of an oxidizing etch environment to remove patterned masking layer 28 (i.e. ashing) causes damage to or modifies exposed portions of dielectric 21 within openings 30, resulting in damaged dielectric regions 32 (also referred to as modified dielectric regions 32). For example, in the example provided above where dielectric 21 includes carbon while capping layer 22 does not, the damage to dielectric 21 to form damaged or modified dielectric regions 32 refers to the removal of carbon from these regions.

Therefore, the thickness of patterned masking layer 28 and the amount of oxygen in the oxidizing etch environment can be used to control the formation of damaged dielectric regions 32. For example, by controlling etch parameters used in removing patterned masking layer 28 (such as, for example, time, power, pressure, temperature, chemistry, and gas flow), the size and shape of damaged dielectric regions 32 can be controlled. Note also that exposed portions of dielectric 21 may have also been damaged or modified by the etch used in forming openings 30; however, in this embodiment, most of damaged dielectric regions 32 is formed during removal of patterned masking layer 28. .

Figure 5:
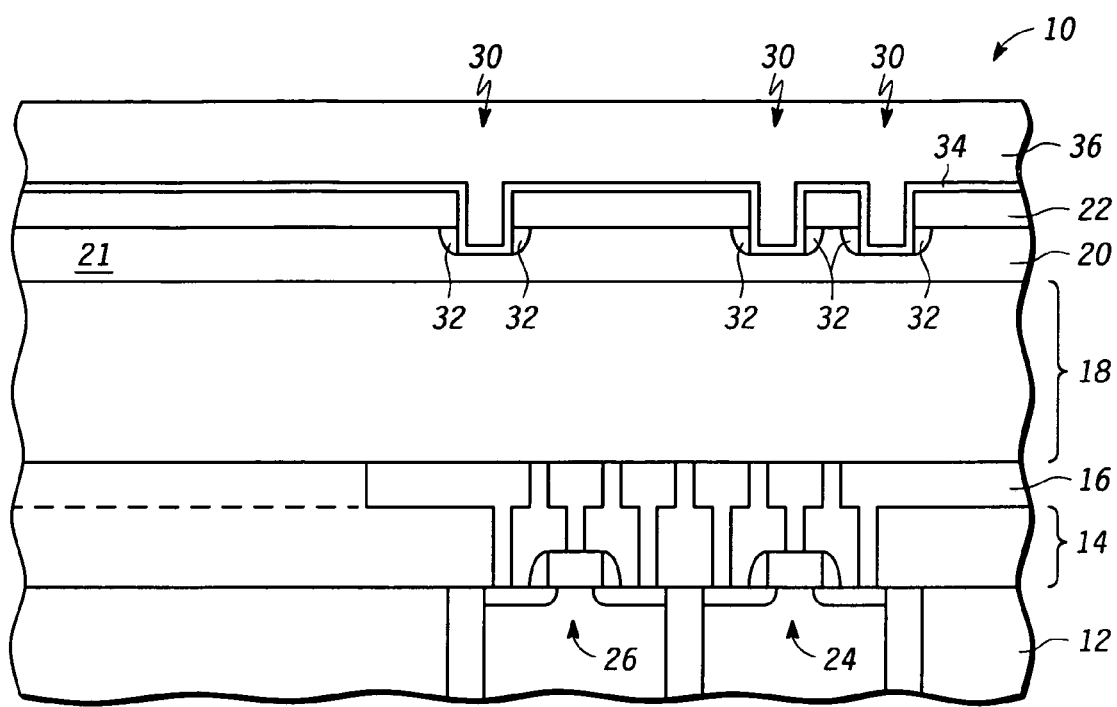

FIG. 5 illustrates semiconductor structure 10 after formation of a barrier layer 34 over capping layer 22 and within openings 30 and a metal layer 36 over barrier layer 34. Barrier layer 34 may be used to prevent the diffusion of metal into underlying layers. In one embodiment, barrier layer 34 may include a combination of materials or layers such as, for example, tantalum, tantalum nitride, titanium nitride, or combinations thereof. In one embodiment, metal layer 36 is formed using electroplating where a seed layer is first formed (using, for example, physical vapor deposition) over barrier layer 34 and where this seed layer is used to electroplate metal layer 36. In one embodiment, metal layer 36 is a copper layer.

Figure 6:
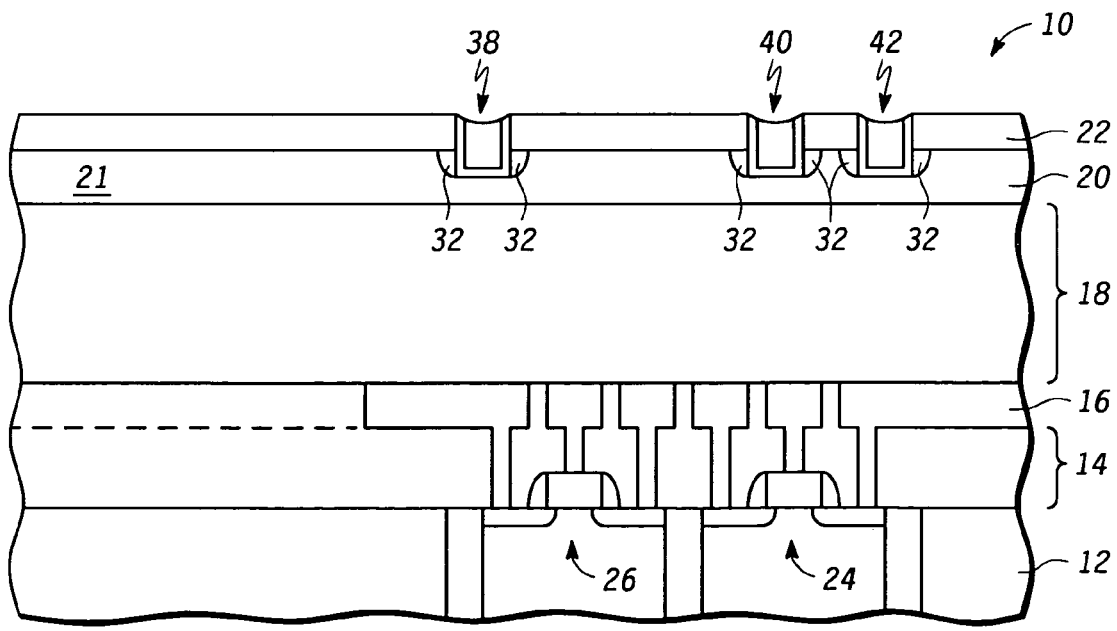

FIG. 6 illustrates semiconductor structure 10 after performing chemical mechanical polishing (CMP) on metal layer 36 and barrier layer 34 to expose underlying capping layer 22. Note that openings 30 are now filled to form metal bond pads 38, 40, and 42 (which, in one embodiment, are copper bond pads 38, 40, and 42). However, due to the CMP, the tops of metal bond pads 38, 40, and 42 may not be straight. That is, the CMP may result in dishing of the metal bond pads, as illustrated in FIG. 6.

FIG. 7 illustrates semiconductor structure 10 after removal of capping layer 22. In one embodiment, an HF wet etch is used to remove capping layer 22, where the etch also removes damaged dielectric portions 32 from final interconnect layer 20. For example, in one embodiment, damaged dielectric portion 32 has a lower carbon content than dielectric 21 of final interconnect layer 22. Therefore, an HF etch may be used to remove the damaged dielectric portions 32 without substantially affecting dielectric 21. Alternatively, other chemistries may be used which remove damaged low-K materials selective to non-damaged or virgin low-K materials. Therefore, the etch chemistries used for the removal of capping layer 22 also results in formation of reservoirs 44, 46, and 48 adjacent each of metal bond pads 38, 40, and 42, respectively. (Note that reservoirs 44, 46, and 48 may also be referred to as reservoir openings.) Also, note that the etch parameters used in previously removing patterned masking layer 28 to control the formation of damaged dielectric portions 32 can therefore be used to control the size and shape of reservoirs 44, 46, and 48. In one embodiment, the formation of reservoirs 44, 46, and 48 results in openings within dielectric 21 surrounding each of metal bond pads 38, 40, and 42, respectively, where these openings have a larger width at the surface of dielectric 21 than the surface of dielectric 21. Also, the removal of capping layer 22 results in protruding metal bond pads which extend above the dielectric of the final interconnect layer. That is, as illustrated in FIG. 7, metal bond pads 38, 40, and 42 extend above dielectric 21 of final interconnect layer 20.

Note that final interconnect layer 20 also includes via portions to connect the metal bond pads, such as metal bond pads 38, 40, and 42, to one or more interconnect layers 18; however, these via portions are not illustrated in the cross sections of FIGS. 3-7. The via openings can be formed before or after the trench openings for metal bond pads 38, 40, and 42, depending on whether a via first trench last or trench first via last integration is being used. Conventional processing may be used to form these vias and therefore, have not been discussed in more detail herein.

Also, in one embodiment, an anti-corrosion metallic coating may be formed on exposed portions of metal bond pads 38, 40, and 42. In the embodiments described above, this may be performed before or after removal of capping layer 22. In one embodiment, this anti-corrosion metallic coating includes gold.

FIG. 8 illustrates semiconductor structure 10 being attached to another semiconductor structure 100 to form a face-to-face 3-D vertical stack integration. Note that each of semiconductor structure 10 and semiconductor structure 100 may be a portion of a die or wafer. (Semiconductor structure 10 and semiconductor structure 100 may also be referred to as semiconductor devices 10 and 100, respectively.) Semiconductor structure 100 includes a substrate 64, a device and contact layer 62 over substrate 64, a first interconnect layer 60 over device and contact layer 62, one or more interconnect layer(s) 58 over first interconnect layer 60, a final interconnect layer 56 over one or more interconnect layer(s) 58 and protruding metal bond pads 54, 52, and 50 formed in final interconnect layer 56 and extending above final interconnect layer 56. Active circuitry is formed on and within substrate 64, where the active circuitry may perform any function or variety of functions. The active circuitry includes any number and type of transistors, such as transistors 126 and 124. Note that transistors 126 and 124 are formed in substrate 64 and device and contact layer 62, and may be any type of transistor having, for example, various different types of source and drain regions, gate dielectrics, gate stacks, spacers, etc., as known in the art. The transistors may be separated by isolation regions in substrate 64. Although only two transistors are illustrated, semiconductor structure 100 may include any number of transistors to form any type of circuitry. Note that the descriptions provided above with respect to substrate 12, device and contact layer 14, transistors 24 and 26, first interconnect layer 16, one or more interconnect layer(s) 18, final interconnect layer 20, and protruding metal bond pads 54, 52, and 50 also apply to substrate 64, device and contact layer 62, transistors 124 and 126, first interconnect layer 60, one or more interconnect layer(s) 58, final interconnect layer 56, and protruding metal bond pads 38, 40, and 42, respectively. Semiconductor structure 100 also includes reservoirs in final interconnect layer 56 adjacent each of metal bond pads 54, 52, and 50. However, note that in alternate embodiments, these reservoirs may not be present. Also, in alternate embodiments, semiconductor structure 100 may have different layers, different types of transistors and circuitries, and different types of metal bond pads. That is, semiconductor structure 100 may not be analogous in form to semiconductor structure 10.

As illustrated in FIG. 8, semiconductor structure 100 is placed over semiconductor structure 10, facing semiconductor structure 10, such that its metal bond pads align with the metal bond pads of semiconductor structure 10. A force is then applied, as indicated by arrows 61, to contact semiconductor structure 10 and 100, as illustrated in FIG. 9. Referring to FIG. 9, protruding metal bond pads 38, 40, and 42 are bonded to protruding metal bond pads 54, 52, and 50, respectively. In one embodiment, the protruding metal bond pads are bonded at an elevated temperature (e.g. a temperature higher than room temperature). Also, in one embodiment, the protruding metal bond pads are deformed by temperature and pressure during bonding. Any laterally flowing excess metal as a result of the bonding is captured into the adjacent reservoirs of semiconductor structure 10 and semiconductor structure 100 (if present in semiconductor structure 100). In this manner, excess metal does not flow over onto final interconnect layer 20 or 56 during bonding, thus preventing shorts between adjacent interconnects. Note that the reservoirs may be completely filled with metal material from the metal bond pads during bonding, or may only partially get filled. Also, the reservoirs may be designed large enough such that the dielectric of final interconnect layer 56 may be brought into contact with the dielectric of final interconnect layer 20. In this embodiment, space 59 between the two semiconductor structures would not be present.

FIGS. 10-15 illustrate formation of a semiconductor structure 200 in accordance with an alternate embodiment of the present invention. Note that like reference numerals in FIGS. 10-15 are used to indicate like elements to those of FIGS. 1-9. In the embodiment of FIG. 10, a patterned masking layer 66 is formed on final interconnect layer 20. That is, no capping layer such as capping layer 22 is formed on final interconnect layer 20 in the current embodiment. Patterned masking layer 66 is analogous to patterned masking layer 28 and the descriptions provided above to patterned masking layer 28 also apply to patterned masking layer 66.

Figure 11:
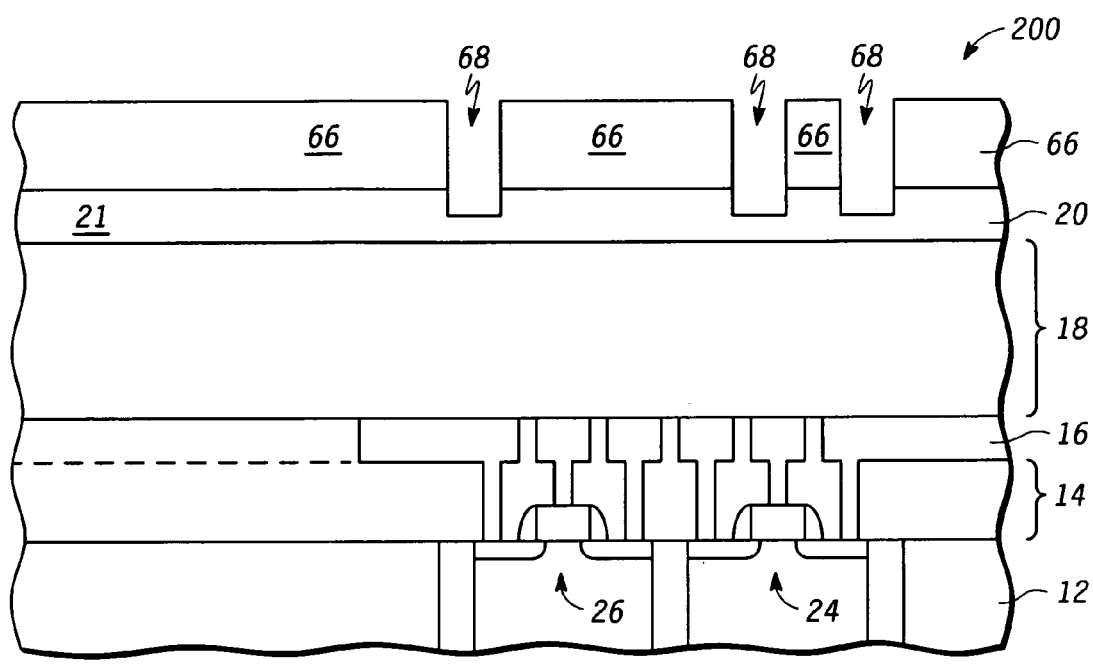

FIG. 11 illustrates semiconductor structure 200 after the formation of openings 68 extending into dielectric 21 of final interconnect layer 20. The same chemistries described above for forming openings 30 apply here to the formation of openings 68. However, in the current embodiment of FIG. 11, no etch through a capping layer is needed since a capping layer is not present.

Figure 12:
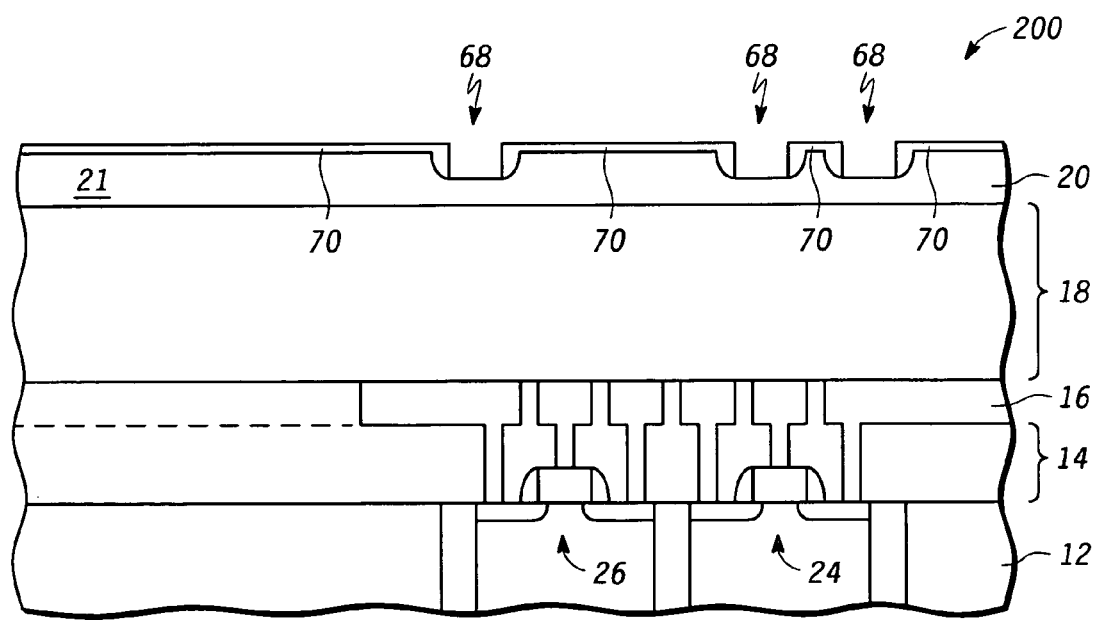

FIG. 12 illustrates semiconductor structure 200 after removal of patterned masking layer 66. As described above with respect to the removal of patterned masking layer 28, an oxidizing etch environment using, for example, an oxygen-containing chemistry or a carbon monoxide chemistry in a plasma environment may be used to remove patterned masking layer 66. The use of an oxidizing etch environment to remove patterned masking layer 66 causes damage to or modifies exposed portions of dielectric 21 within openings 30 and along a surface of dielectric 21, resulting in damaged dielectric region 70 (also referred to as modified dielectric region 70). In one embodiment, damage or modification to form damaged or modified dielectric region 70 refers to the removal of carbon in these regions. Therefore, the thickness of patterned masking layer 66 and the amount of oxygen in the oxidizing etch environment can be used to control the formation of damaged dielectric region 70. For example, by controlling etch parameters used in removing patterned masking layer 66 (such as, for example, time, power, pressure, temperature, chemistry, and gas flow), the size and shape of damaged dielectric region 70 can be controlled. Note also that exposed portions of dielectric 21 may have also been damaged by the etch used in forming openings 68; however, in this embodiment, most of damaged dielectric region 70 is formed during removal of patterned masking layer 66.

Figure 13:
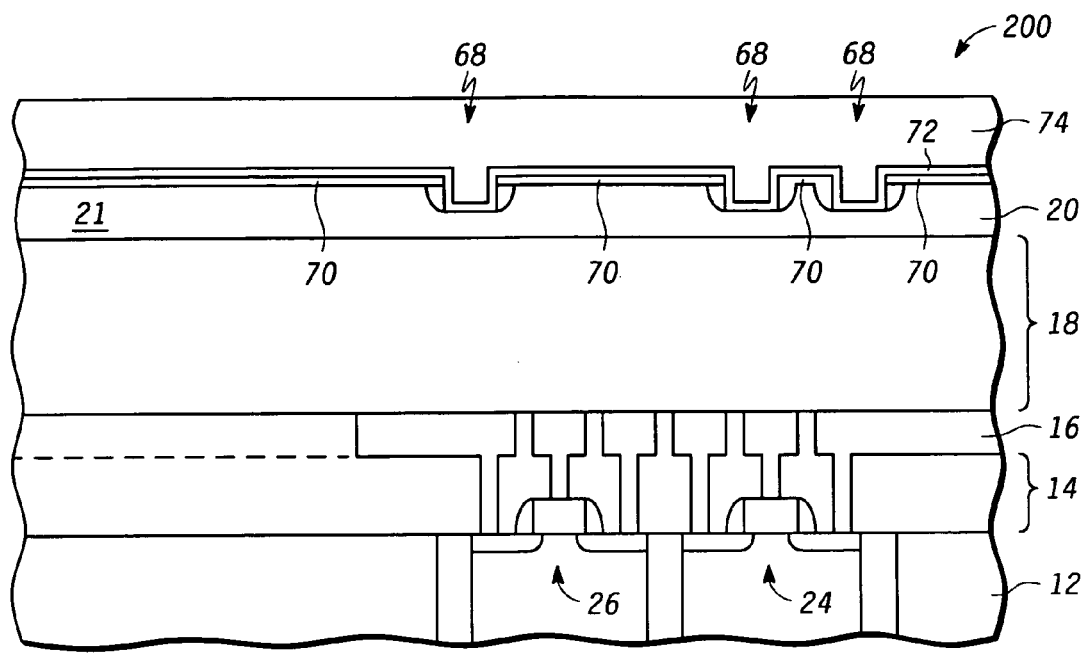

FIG. 13 illustrates semiconductor structure 200 after formation of a barrier layer 72 over final interconnect layer 20 and within openings 68 and metal layer 74 over barrier layer 72. The descriptions (including materials and methods for forming) provided above with respect to barrier layer 34 and metal layer 36 also apply here to barrier layer 72 and metal layer 74, respectively.

Figure 14:
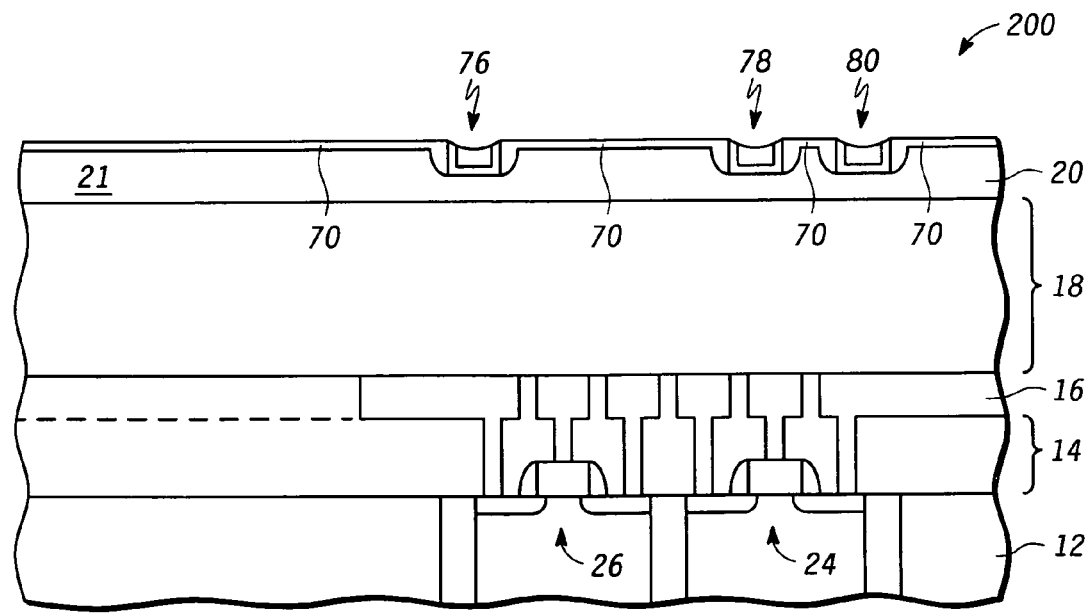

FIG. 14 illustrates semiconductor structure 200 after performing CMP of metal layer 74 and barrier layer 72 to expose underlying final interconnect layer 20. Note that openings 66 are now filled to form metal bond pads 76, 78, and 80. However, due to the CMP, the tops of metal bond pads 76, 78, and 80 may not be straight. That is, the CMP may result in dishing of the metal bond pads, as illustrated in FIG. 14.

Figure 15:
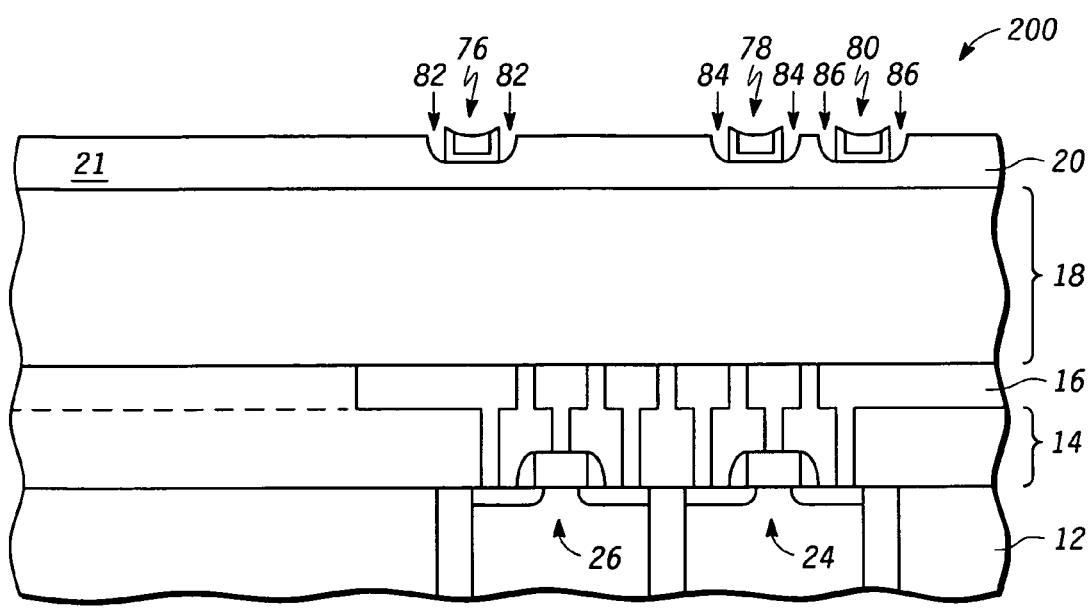

FIG. 15 illustrates semiconductor structure 200 after removal of damage portion 70 to form reservoirs 82, 84, and 86 adjacent metal bond pads 76, 78, and 80, respectively. In one embodiment, an HF etch is used to remove damaged dielectric portion 70 from final interconnect layer 20. For example, in one embodiment, damaged dielectric portion 70 has a lower carbon content than dielectric 21 of final interconnect layer 22. Therefore, an HF etch may be used to remove the damaged dielectric portion 70 without substantially affecting dielectric 21. Alternatively, other chemistries may be used which remove damaged low-K materials selective to non-damaged or virgin low-K materials. In one embodiment, the formation of reservoirs 82, 84, and 86 results in openings within dielectric 21 surrounding each of metal bond pads 76, 78, and 80, respectively, where these openings have a larger width at the surface of dielectric 21 than below the surface of dielectric 21. Note that the removal of damaged dielectric portion 70 from the top surface of dielectric 21 also results in protruding metal bond pads which extend above the dielectric of the final interconnect layer. That is, as illustrated in FIG. 15, metal bond pads 76, 78, and 80 extend above dielectric 21 of final interconnect layer 20. Therefore, note that the etch parameters used in previously removing patterned masking layer 66 to control the formation of damaged dielectric portion 70 can therefore be used to control the size and shape of reservoirs 44, 46, and 48, and to control how much metal bond pads 76, 78, and 80 extend above dielectric 21.

By now it should be appreciated that there has been provided a semiconductor structure having metal bond pads and reservoirs or openings adjacent the metal bond pads to allow for improved semiconductor interconnects for bonding, such as in 3-D vertical stack integrations. Furthermore, the metal bond pads of the semiconductor structure may protrude above the final dielectric to also allow for improved interconnects. The reservoirs may be used to contain excess metal during the bonding process to bond the metal bond pads of a die or wafer to another die or wafer, thus preventing shorts which can be caused by the laterally flowing metal spilled from the interconnects during bonding. Also, note that any shape or size of openings adjacent the metal bond pads may be used, as desired. The size and shape of these reservoirs or openings may be controlled by controlling parameters of the etches which initially cause damage to or modifies the dielectric of the final interconnect layer in which the bond pads are formed. Furthermore, the size and shape of the reservoirs can be designed so as to allow for the dielectrics of the two semiconductor structures being stacked to contact each other as well.

The terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The term "plurality", as used herein, is defined as two or more than two. The term another, as used herein, is defined as at least a second or more.

The term "coupled", as used herein, is defined as connected, although not necessarily directly, and not necessarily mechanically.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described.

Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method of forming a semiconductor device comprising:
   providing a substrate having an overlying device layer;
   forming a plurality of devices within the substrate and within the overlying device layer;
   forming one or more interconnect layers overlying the device layer;
   forming a dielectric layer surrounding an uppermost of the one or more interconnect layers;
   forming openings in the dielectric layer;
   filling the openings with a conductive material;
   removing an exposed portion of the dielectric layer to form protruding pads of the conductive material extending above the dielectric layer; and
   forming reservoir openings within the dielectric and adjacent the protruding pads.

2. The method of claim 1 further comprising:
   forming an insulating capping layer overlying the dielectric layer that is dissimilar in material from the dielectric layer, the insulating capping layer protecting underlying portions of the dielectric layer.

3. The method of claim 1 wherein the forming of openings in the dielectric layer results in modified portions of the dielectric layer along portions of sidewalls of the openings.

4. The method of claim 1 further comprising:
   coupling protruding metallic pads of a second semiconductor device to the protruding pads of the semiconductor device;
   deforming the protruding pads of the semiconductor device by temperature and pressure; and
   capturing any laterally flowing portion of metallic pads of the second semiconductor and the protruding pads of the semiconductor device within the reservoir openings.

5. The method of claim 1, wherein the reservoir openings have a larger width at a surface of the dielectric layer than below the surface of the dielectric layer.

6. The method of claim 3 wherein forming the reservoir openings further comprises:
   removing the modified portions of the dielectric layer to form the reservoir openings.

7. The method of claim 3 wherein forming the openings further comprise:
   providing a patterned masking layer on top of an insulating capping layer overlying the dielectric layer;
   etching the dielectric layer and the insulating capping layer;
   removing the patterned masking layer in an oxidizing chemistry in a plasma environment; and
   controlling removal of the patterned masking layer to size the modified portions of the dielectric layer, thereby controlling size of the reservoir openings.

8. The method of claim 7 wherein controlling removal of the patterned masking layer further comprises controlling at least one of controlling a time required to remove the patterned masking layer, power used to remove the patterned masking layer, pressure used to remove the patterned masking layer, temperature used to remove the patterned masking layer and controlling a removing chemistry.

9. The method of claim 6 wherein forming the openings further comprise:

provoking a patterned masking layer on top of an insulating capping layer overlying the dielectric layer;

etching the dielectric layer and the insulating capping layer;

removing the patterned masking layer in an oxidizing chemistry in a plasma environment; and controlling removal of the patterned masking layer to size the modified portions of the dielectric layer, thereby controlling size of the reservoir openings.

10. The method of claim 4 further comprising:

forming additional reservoir openings adjacent the protruding metallic pads of the second semiconductor device for additional capturing of any laterally flowing portion of metallic pads of the second semiconductor and the protruding pads of the semiconductor device.

* * * * *